United States Patent
Lin et al.

(10) Patent No.: US 6,958,896 B2
(45) Date of Patent: Oct. 25, 2005

(54) EARLY TRIGGERED ESD MOSFET PROTECTION CIRCUIT AND METHOD THEREOF

(75) Inventors: Shi-Tron Lin, Taipei (TW); Wei-Fan Chen, Taichung (TW); Chen-Hsin Lien, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 456 days.

(21) Appl. No.: 10/256,445

(22) Filed: Sep. 27, 2002

(65) Prior Publication Data

US 2003/0214768 A1 Nov. 20, 2003

(30) Foreign Application Priority Data

May 15, 2002 (TW) .................................... 91110142 A

(51) Int. Cl.⁷ .................................................. H02H 9/00
(52) U.S. Cl. ...................................................... 361/56
(58) Field of Search ............................................. 361/56

(56) References Cited

U.S. PATENT DOCUMENTS

| | | | | |
|---|---|---|---|---|
| 5,218,222 A | * | 6/1993 | Roberts | 257/362 |
| 5,701,024 A | * | 12/1997 | Watt | 257/360 |
| 5,852,541 A | * | 12/1998 | Lin et al. | 361/111 |
| 5,870,268 A | * | 2/1999 | Lin et al. | 361/111 |
| 5,982,601 A | * | 11/1999 | Lin | 361/111 |
| 6,043,967 A | * | 3/2000 | Lin | 361/111 |
| 6,064,556 A | * | 5/2000 | Ravanelli | 361/111 |
| 6,091,593 A | * | 7/2000 | Lin | 361/111 |
| 6,304,127 B1 | * | 10/2001 | Lin | 327/321 |
| 6,611,025 B2 | * | 8/2003 | Lin | 257/355 |

* cited by examiner

Primary Examiner—Stephen W. Jackson
Assistant Examiner—James A Demakis
(74) Attorney, Agent, or Firm—Birch, Stewart, Kolasch & Birch, LLP

(57) ABSTRACT

An early triggered MOSFET ESD protection circuit based on reduction of the trigger voltage is described. A transient negative voltage is generated and applied to a gate of a MOSFET during a positive ESD event. The instant invention improves ESD performance, and is particularly useful for thin gate oxide of 40 Å and less.

19 Claims, 4 Drawing Sheets

EARLY TRIGGERED ESD MOSFET PROTECTION CIRCUIT AND METHOD THEREOF

Pursuant to 35 U.S.C. § 119(a)–(d), this application claims priority from Taiwanese application No. 91110142, filed on May 15, 2002.

BACKGROUND OF THE INVENTION

1. Field of the Invention

The present invention relates to an ESD protection circuit and particularly to an early triggered MOSFET ESD protection circuit.

2. Description of the Prior Art

An NMOS transistor can be used as an ESD protection device. In one application, with the gate connected to the gate-driving signal, the NMOSFET is used as the pull-down device of a CMOS buffer to drive the output voltage. In another application, with the gate electrically coupled to the ground, the NMOSFET is used to protect an input pin or power bus during an ESD event.

The ESD protection of an NMOSFET heavily depends on the snapback mechanism for conducting large ESD currents between the drain and source. At the beginning, the high electric field at the drain junction causes impact ionization with generation of both minority and majority carriers. The minority carriers are collected at the drain (anode), while the majority carriers flow toward the substrate or p-well contact (cathode) causing a local potential build up in the p-well. When the local substrate potential is 0.8V higher than the adjacent n+ source potential, the source junction becomes forward biased. The forward biased source junction injects minority carriers into the p-well. Some of those injected minority carriers are recombined in the substrate while the rest reach the drain junction to further enhance the impact ionization. As a continuous loop, the MOSFET enters a low impedance (snapback) state to conduct large ESD currents.

FIG. 1 is a diagram showing a conventional gate coupled MOSFET ESD protection circuit. The gate potential of the shunt transistor N1 is raised to approximately 1 to 2 volts during a positive-voltage ESD event, to reduce the ESD trigger voltage and enhance the uniform turn on of a multiple-gate-finger NMOSFET.

U.S. Pat. No. 6,304,127, 6,091,593 and 5,870,268 described methods of generating a negative transient voltage during a positive-voltage ESD event. The negative transient voltages were applied to a diffusion or well region to trigger an ESD protection device early, by either increasing the terminal voltage difference, or causing a forward-biased junction for carrier injection.

SUMMARY OF THE INVENTION

The object of the present invention is to provide a method and circuit for early triggering of an MOSFET ESD protection circuit.

The present invention provides an early triggered MOSFET ESD protection circuit providing an ESD path form a first to a second node when an ESD voltage is applied to the first node. The circuit comprises a first transistor having a drain coupled to the first node and a source coupled to the second node, and providing the ESD path by entering snapback when the ESD voltage is applied to the first node, and an ESD-transient negative voltage generator receiving the ESD voltage and outputting an ESD-transient negative voltage to a gate of the first transistor to reduce a triggering voltage for the first transistor to enter snapback when the ESD voltage is applied to the first node.

The present invention further provides a method for early triggering of an ESD protection circuit for an integrated circuit. The ESD protection circuit has a MOS transistor with a drain coupled to a first node and a source coupled to a second node. The method comprises the step of receiving an ESD voltage and outputting an ESD-transient negative voltage to a gate of the MOS transistor to reduce a triggering voltage for the MOS transistor to enter snapback when the ESD voltage is applied to the first node.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description give hereinbelow and the accompanying drawings, which are given by way of illustration only and thus are not limitative of the present invention.

DETAILED DESCRIPTION OF THE INVENTION

Figure 1:
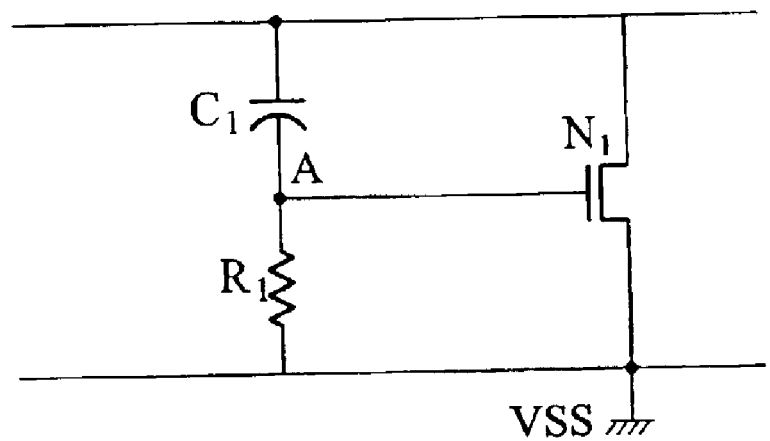
FIG. 1 is a diagram showing a conventional gate coupled MOSFET ESD protection circuit.
Figure 2:
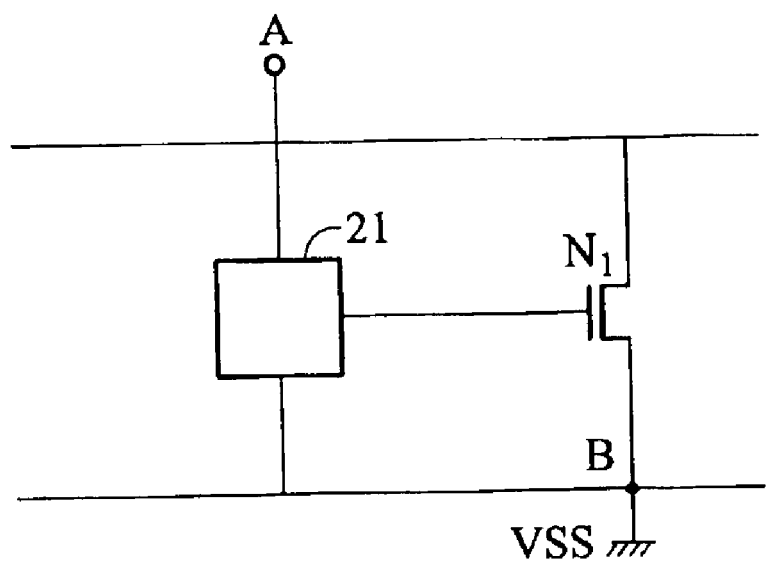
FIG. 2 is a diagram showing an ESD protection circuit according to a first embodiment of the invention.

FIG. 2 is a diagram showing an ESD protection circuit according to a first embodiment of the invention. The early trigger MOSFET ESD protection circuit provides an ESD path from a node A (such as a pad or VDD power bus) to a node B (such a VSS power bus) when an ESD voltage is applied to the node A. The circuit comprises a shunt transistor N1 and an ESD-transient negative voltage generator. The shunt transistor N1 has a drain coupled to the node A and a source coupled to the node B, and providing the ESD path by entering snapback when the ESD voltage is applied to the node A. The ESD-transient negative voltage generator receives the ESD voltage and outputs an ESD-transient negative voltage to a gate of the shunt transistor N1 to reduce a triggering voltage for the shunt transistor N1 to enter snapback when the ESD voltage is applied to the node A.

Based on experimental data and simulation results, it were found that for a NMOSFET having a gate oxide layer with a thickness of 40 Å, the triggering voltage is reduced by around 1.5V when a −2 volt gate potential is applied. This is in part due to the distribution of electrical field at the drain junction near the gate, and in part due to GIDL (Gate-Induced Drain Leakage) that enhance drain junction leakage to help accelerate the drain-junction impact ionization.

Figure 3:
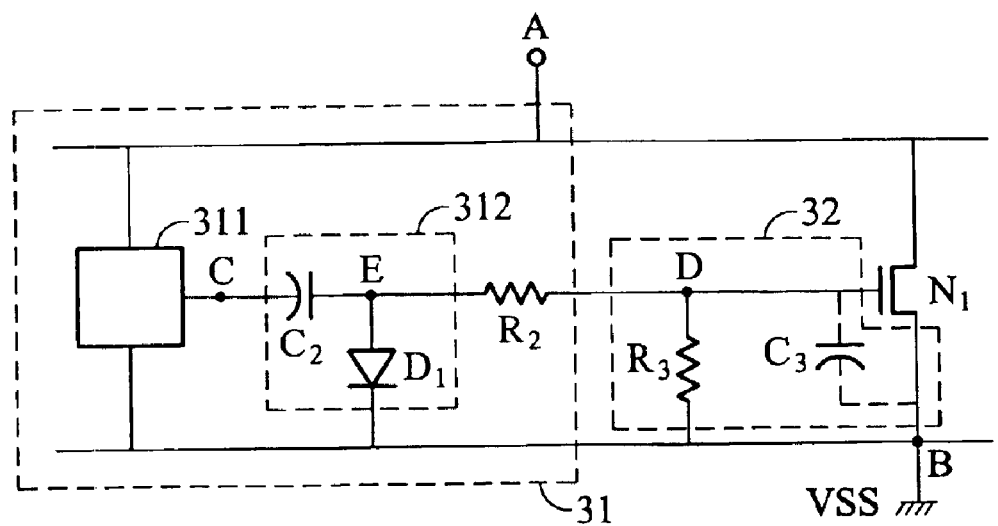
FIG. 3 is a diagram showing an ESD protection circuit according to a second embodiment of the invention.

FIG. 3 is a diagram showing an ESD protection circuit according to a second embodiment of the invention. This circuit is similar to that shown in FIG. 2 and comprises a shunt transistor N1 and an ESD-transient negative voltage generator 31. A resistor R3 is added between the gate of the shunt transistor N1 and the node B. The capacitor C3 coupled between the gate and source of the shunt transistor can be a parasitic gate-to-source capacitor.

The ESD-transient negative voltage generator 31 comprises a transient oscillation circuit 311 outputting an oscillation signal, a charge pump circuit 312 receiving the oscillation signal, and a resistor R2 coupled between the charge pump circuit 312 and the gate of the shunt transistor N1. As an example, the resistance R2 ranges from 500 to 5K Ω.

During a positive ESD-voltage rising transient, a train of negative voltage spikes is generated at the node E. There is an optionally added resistive component R2 (or R2 can be just the interconnect resistance). The R2–C3 (capacitance-diode) combination forms a rectifying RC circuit to create a more stable negative voltage at the gate. The generated transient negative voltage at the gate provides early triggering of the shunt transistor N1. Note that the capacitor C3 can be a parasitic gate-to-substrate capacitance, or it can be a separate capacitive element. The resistor R3 is used to pull the gate of the shunt transistor N1 to ground during normal operation of the integrated circuit.

Figure 4:
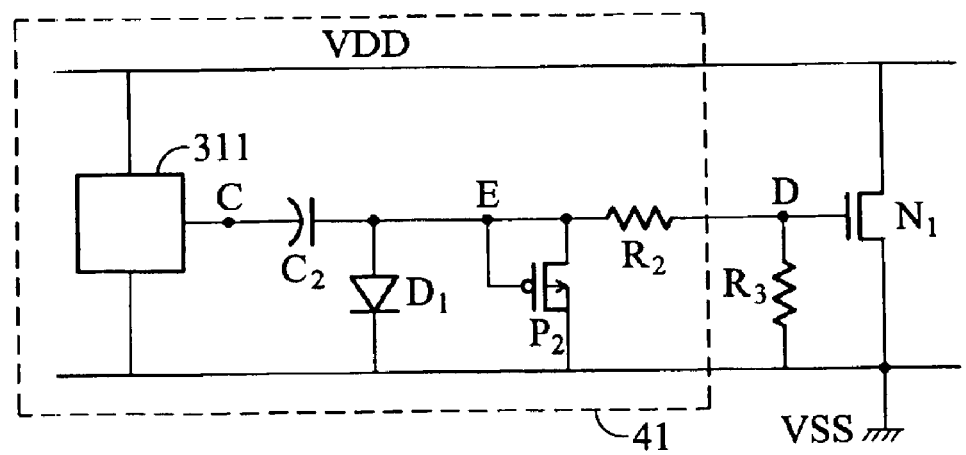
FIG. 4 is a diagram showing an ESD protection circuit according to a third embodiment of the invention.

FIG. 4 is a diagram showing an ESD protection circuit according to a third embodiment of the invention. In FIG. 4, compared to FIG. 3, a PMOS transistor P2 is a diode-configured MOSFET. The transistor P2 adjusts the level of negative voltage. The transistor P2 starts to conduct as the voltage at the node E drops below a threshold voltage (e.g., −0.6V) of the transistor P2. This can limit the maximum negative voltage to a desired value, for example, −2V. The actual design (the size of each component) can be chosen and optimized based on circuit simulation and desired negative-voltage level during an ESD transient.

Note that in FIG. 4 the diode D1 is optional, as there is already a parasitic p+/n-well diode built into the transistor P2. Further, diode D1 has exponentially increased current after turning on ($V_E$>0.7V), while the transistor P2 has quadratic increased current after turning on ($V_E$ being more negative than the transistor P2 threshold voltage, say, $V_E$<−0.6V). As an example, during the ESD transient, $V_E$ is pinned at 0.7V to around 1V when pulled high, and clamped at around −0.6V to around 2V when pulled low by the oscillation voltage at the node E. As a result, there is an averaged negative voltage of around −1V at the node E.

Figure 5:
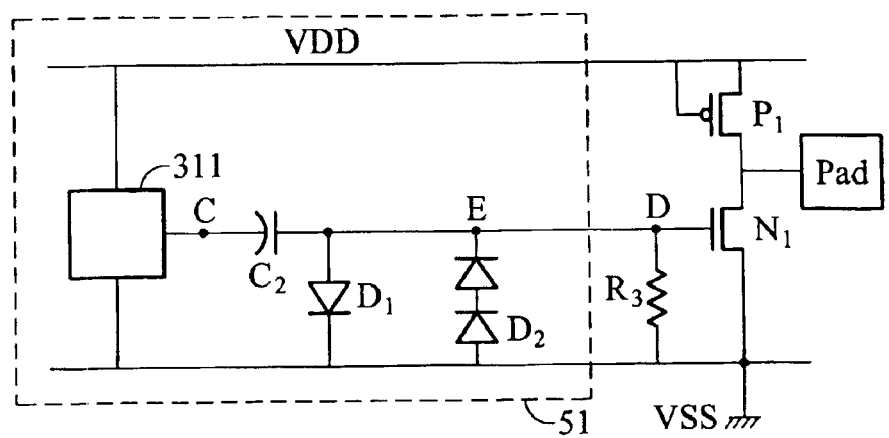
FIG. 5 is a diagram showing an ESD protection circuit according to a fourth embodiment of the invention.

FIG. 5 is a diagram showing an ESD protection circuit according to a fourth embodiment of the invention. This is an alternative circuit of the one shown in FIG. 4. A series of diodes D2 replaces the transistor P2 in FIG. 4. The diode string starts to conduct as the voltage at the node E drops below 2×−0.7V=−1.4V. The transient negative voltage is roughly in the range of −1.5 to −2V, which avoids breakdown of the gate oxide layer of the transistor N1.

Figure 6:
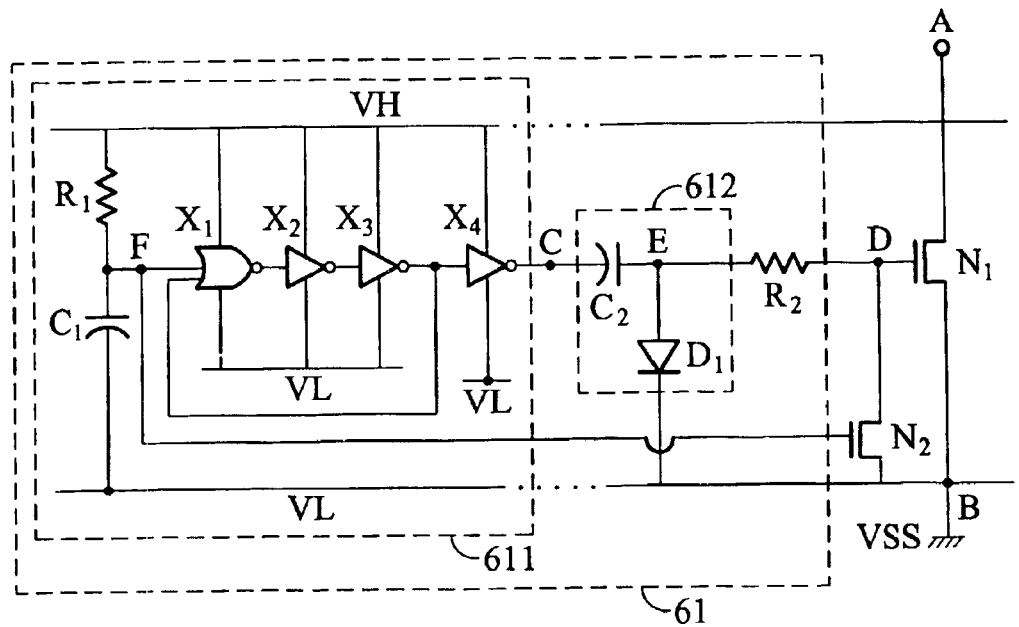
FIG. 6 is a diagram showing an ESD protection circuit according to a fifth embodiment of the invention.

FIG. 6 is a diagram showing an ESD protection circuit according to a fifth embodiment of the invention. This circuit comprises a shunt transistor N1 providing the ESD path and an ESD-transient negative voltage generator 61.

Additionally, a transistor N2 is included, which has a drain coupled to the gate of the transistor N1, a source coupled to the node B and a gate coupled to the node F.

The ESD-transient negative voltage generator 61 comprises a transient oscillation circuit 611 coupled between the nodes A and B and outputting an oscillation signal at the node C, a charge pump circuit 612 receiving the oscillation signal, and a resistor R2 coupled between the charge pump circuit 612 and the gate of the shunt transistor N1. The charge pump circuit 612 is composed of a capacitor C2 and a diode D1. The transient oscillation circuit 611 comprises a capacitor C1, a resistor R1 and an inverting gate composed of, for example, a NOR gate X1 and three inverters X2, X3 and X4. During a positive pad (or VDD power bus)-to-VSS power bus ESD event, as the transient ESD voltage increases, the oscillation signal with increasing magnitude is generated at the node C, and negative voltage spikes are generated at the node E. With the low-pass filtering circuit of the resistor R2 and the gate capacitance of the transistor N1, a more stable negative voltage in the order of −1 to −2 volt can be generated at the node E. The R1C1 time constant (e.g., in the range of 30 ns to 200 ns) keeps the node F at low initially and allows the transient oscillator to oscillates during a human-body-model ESD event; but terminates the oscillation at the later/final stage of an ESD event and during IC powerup or operation. During powering up or IC operation, the node F is pulled up to high to turn on the NMOSFET N2, thus keeping the node D low to keep the transistor N1 in a stable OFF state.

In the sixth embodiment, the transistor N2 can be replaced by the resistor R3 and capacitor C3 shown in FIG. 3, or by the resistor R3 shown in FIG. 4. Further, the NOR gate X1 can be replaced by a NAND gate with the resistor R1 and the capacitor C1 interchanged position.

Figure 7:
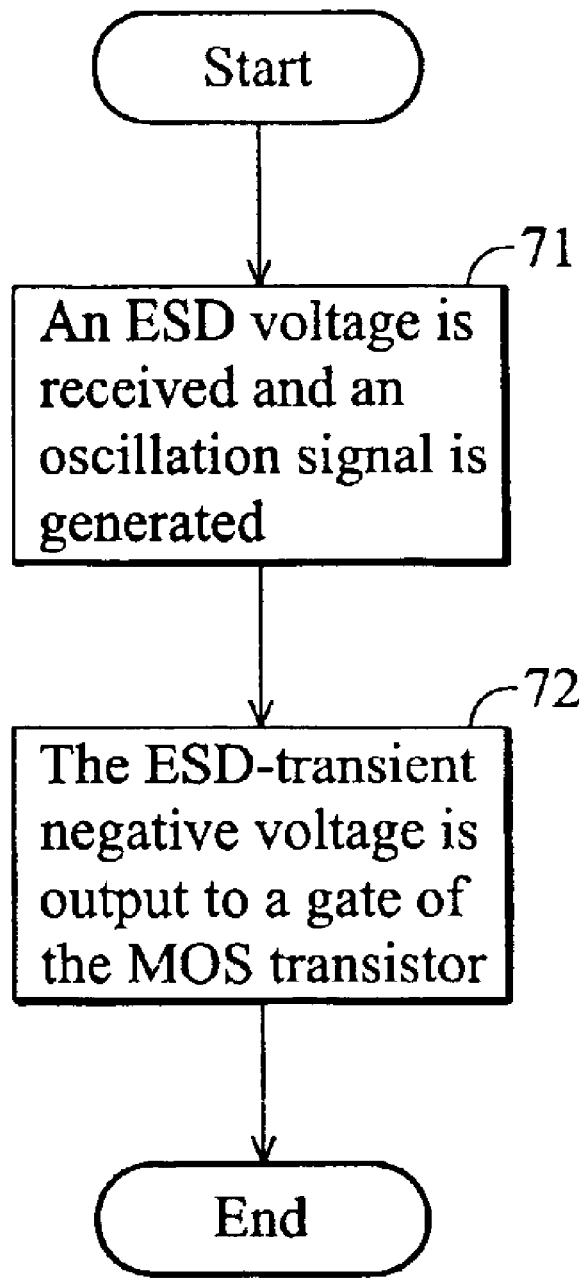
FIG. 7 is a flowchart of a method for early triggering of an ESD protection circuit according to one embodiment of the invention.

FIG. 7 is a flowchart of a method for early triggering of an ESD protection circuit according to one embodiment of the invention. The ESD protection circuit has a MOS transistor with a drain coupled to a first node and a source coupled to a second node. The first node can be a pad or VDD power bus, and the second node can be a VSS power bus.

In step 71, an ESD voltage is received and an oscillation signal is generated using the ESD voltage to provide an ESD-transient negative voltage.

In step 72, the ESD-transient negative voltage is output to a gate of the MOS transistor to reduce a triggering voltage for the MOS transistor to enter snapback when the ESD voltage is applied to the first node the MOS transistor is turned off during normal operation of the integrated circuit.

In conclusion, an early triggered MOSFET ESD protection circuit is provided. A transient negative voltage is generated and applied to a gate of a MOSFET during a positive ESD event, to reduce the trigger voltage. The instant invention is particularly useful for, though not limited to, thin gate oxide of 40 Å and less.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An MOSFET ESD protection circuit coupled between a first and a second node, the circuit comprising:
   a first transistor having a drain coupled to the first node and a source coupled to the second node;
   an ESD-transient negative voltage generator receiving an ESD voltage and outputting an ESD-transient negative voltage to a gate of the first transistor to reduce a triggering voltage of the first transistor during an ESD; and
   a rectifier receiving and rectifying the ESD-transient negative voltage, and outputting the rectified ESD-transient negative voltage to the gate of the first transistor.

2. An MOSFET ESD protection circuit coupled between a first and a second node, the circuit comprising:
   a first transistor having a drain coupled to the first node and a source coupled to the second node;
   an ESD-transient negative voltage generator receiving an ESD voltage and outputting an ESD-transient negative voltage to a gate of the first transistor to reduce a triggering voltage of the first transistor during an ESD event; and
   a diode coupled between the gate of the first transistor and the second node.

3. The circuit as claimed in claim 2, wherein the ESD-transient negative voltage generator comprises:
   a transient oscillation circuit receiving the ESD voltage and generating an oscillation signal when the ESD voltage is applied to the first node; and
   a first capacitor having one end coupled to receive the oscillation signal and the other end coupled to the gate of the first transistor.

4. The circuit as claimed in claim 3 further comprising a second transistor having a drain and gate commonly coupled to the gate of the first transistor, and a source coupled to the second node.

5. The circuit as claimed in claim 3, wherein the transient oscillation circuit comprises:
   an inverting gate having at least one inverting logic gate; and
   a plurality of inverters connected in series, having a first inverter with an input coupled to an output of the inverting gate and a last inverter with an output coupled to a first input of the inverting gate.

6. The circuit as claimed in claim 5 further comprising: a second capacitor coupled to a second input of the inverting gate; and a second resistor coupled to the second input of the inverting gate.

7. The circuit as claimed in claim 6, wherein the inverting gate is a NOR gate and the second resistor is coupled to the first node.

8. The circuit as claimed in claim 6, wherein the inverting gate is a NAND gate and the second resistor is coupled to the second node.

9. The circuit as claimed in claim 2 further comprising a plurality of diodes serially coupled between the gate of the first transistor and the second node.

10. The circuit as claimed in claim 2 further comprising a switch connected between the gate of the first transistor and the second node.

11. The circuit as claimed in claim 2, wherein the first node is a pad.

12. The circuit as claimed in claim 2, wherein the first node is a VDD power bus.

13. The circuit as claimed in claim 2, wherein the second node is a VSS power bus.

14. The circuit as claimed in claim 2, wherein the first transistor has a gate oxide layer with a thickness less than 75 Å.

15. The circuit as claimed in claim 2, wherein the first transistor has a gate oxide layer with a thickness less than 45 Å.

16. The circuit as claimed in claim 2, wherein the first transistor has a gate oxide layer with a thickness smaller than 25 Å.

17. A method for early triggering of an ESD protection circuit for an integrated circuit, the ESD protection circuit having a MOS transistor with a drain coupled to a first node and a source coupled to a second node, the method comprising the step of:
   receiving an ESD voltage and generating an ESD-transient negative voltage; and
   rectifying and outputting the ESD-transient negative voltage to a gate of the MOS transistor to reduce a triggering voltage for the MOS transistor to enter snapback when the ESD voltage is applied to the first node.

18. The method as claimed in claim 17 further comprising the step of: turning off the MOS transistor during normal operation of the integrated circuit.

19. The method as claimed in claim 17 further comprising the step of:
   generating an oscillation signal based on the ESD voltage to provide the ESD-transient negative voltage.

* * * * *